United States Patent [19]
Wei

[11] Patent Number: 5,113,143
[45] Date of Patent: May 12, 1992

[54] CHOPPER AMPLIFIER FOR MEASURING LOW DC CURRENT

[75] Inventor: Sen-Jung Wei, Hyattsville, Md.

[73] Assignee: University of Maryland, College Park, Md.

[21] Appl. No.: 681,941

[22] Filed: Apr. 8, 1991

[51] Int. Cl.⁵ ............................................. H03F 3/38
[52] U.S. Cl. .................................. 330/10; 73/304 R
[58] Field of Search ........................ 73/304 C, 304 R; 324/142; 330/9, 10, 253, 277

[56] References Cited

U.S. PATENT DOCUMENTS

| | | | |
|---|---|---|---|
| 4,765,187 | 8/1988 | Weinstein | 73/304 R |
| 4,912,423 | 3/1990 | Milkovic et al. | 330/9 X |
| 5,049,878 | 9/1991 | Stern | 73/304 C X |

Primary Examiner—Steven Mottola
Attorney, Agent, or Firm—Hung Chang Lin

[57] ABSTRACT

A current mode chopper amplifier is used to convert low dc current flowing in a resistive element into ac for signal processing to eliminate drift and noise. The ac signal is then converted back to dc as output. The input circuit for the chopper is an operational amplifier driving a pass transistor and serving also as a voltage follower, which drives the resistive element. A polarizing voltage is applied to the input of the operational amplifier, and followed by the resistive element. The current in the resistive element flows through the pass transistor to the chopper, but not through the polarizing voltage source.

11 Claims, 2 Drawing Sheets

WE: working electrode
RE: reference electrode

CHOPPER AMPLIFIER FOR MEASURING LOW DC CURRENT

BACKGROUND

In electronic equipment for measuring low dc currents, stability and noise often are the limiting factors. One application of such an equipment is found in the medical and chemical analytical instruments, where a small amount of certain gas in a solution, such as oxygen in blood, is to be determined by measuring the current when a polarizing voltage is impressed. In such an application, the dc current level is usually very low, in the sub-nanoampere range. The measurement of such a low current usually encounters the problems of drift and noise. In addition, the physical dimension of such an apparatus often must be miniaturized for insertion into medical probes. For miniaturization, it is desirable to employ integrated circuit (IC) technology, for which complementary metal-oxide-semiconductor (CMOS) field effect transistors (MOSFET) are most widely used. For MOSFETs, the 1/f noise is a serious problem.

The stablity problem is mostly due to temperature effect. Any imbalance in the different components in an IC, such as MOSFETs or resistors, can cause current drift.

At low dc currents, the noise and drift can be comparable to the current to be measured. As a result, stable and accurate low current measurement is difficult to achieve.

In another application for measuring resistance, the principle is usually to divide the voltage across the resistance by the current flowing through the resistance. In practice, it is not desirable to derive the loop current from the applied voltage, because the contact resistance of the voltage probe may give rise to undesirable voltage drop. Therefore, the so-called "Kelvin" measurement is often used for this purpose. In the Kelvin measurement four probes are used. The current is caused to flow in the two outer probes, and the voltage is measured from the two inner probes. In this manner, no current flows in the voltage probes to introduce a voltage drop, and the measured voltage is then accurate. However, it is impractical to use this method to measure the resistance of a liquid solution.

SUMMARY

The object of his invention is to measure low dc current in the sub-nanoampere range free of instablity and noise. Another object of this invention is to fabricate a stable low current amplifier integrated circuit for low current measurement. Still another object of this invention is to devise a low current probe for chemical and medical analysis of a liquid solution, where a polarizing voltage is applied. A further object of this invention is to implement a circuit using Kelvin method to measure resistance of a liquid solution.

These objects are achieved in this invention by using a high input impedance transconductance amplifier driving a current mode chopper to convert the dc current into ac signal. After the ac signal is processed and demodulated, an amplified replica of the original dc current is obtained. The transconductance amplifier also serves as a voltage follower, transferring input polarizing voltage across a resistance such as that of a liquid solution. The current through the resistance, however, flows out from the transconductance amplifier to the chopper and not through the polarizing voltage source.

The transconductance amplifier can be made of an operational amplifier driving a pass transistor. A feature of this kind of amplifier is that the input offset voltage of the operational amplifier is almost zero. Thus, the voltage follower follows the polarizing voltage accurately.

DETAILED DESCRIPTION OF THE PREFERRED EMBODIMENT

The basic circuit of the present invention is a transconductance amplifier driving a chopper. In this circuit, the transconductance amplifier 10 is constituted of an operational amplifier OP and a pass transistor M1. The output of the OP is connected to the input gate of M1.

Figure 1:
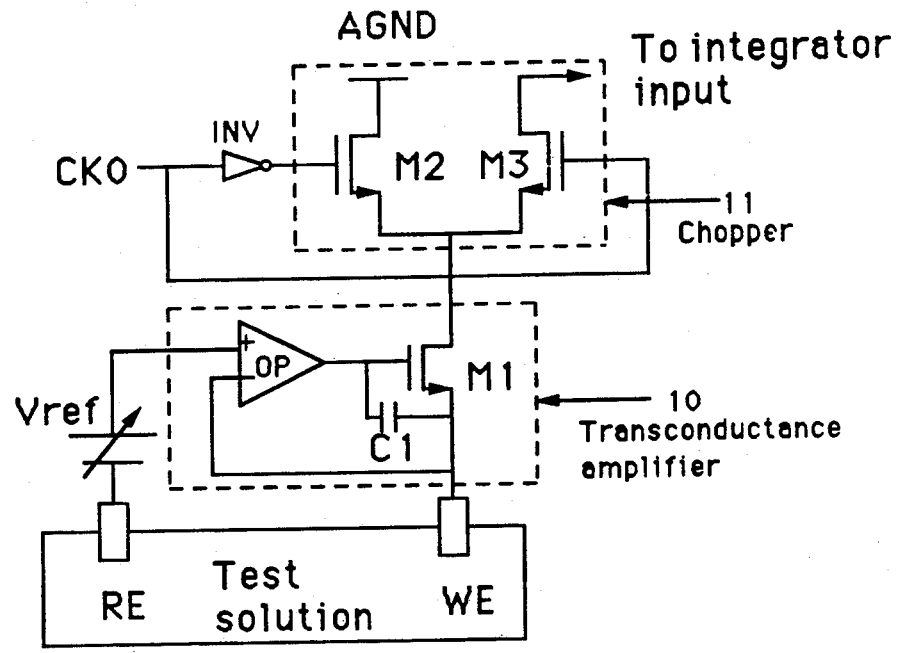
FIG. 1 shows the basic transconductance amplifier of this invention, and the chopper for converting dc into ac signals.
Figure 1A:
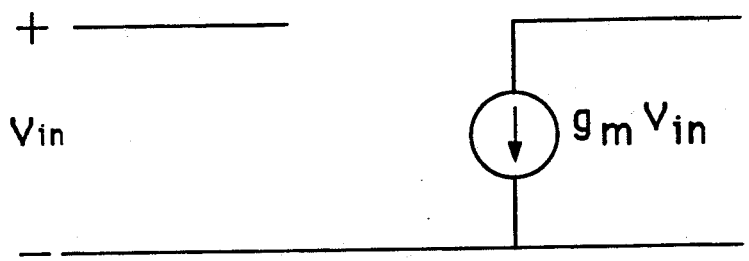
FIG. 1(a) is an equivalent circuit of the transconductance amplifier.

The transconductance amplifier 10 can be represented by a macro model as shown in FIG. 1(a). Here, the OP and the pass transistor M1 are equivalent to a circuit with a dependent current source $g_m V_{in}$, where $g_m$ is the transconductance and $V_{in}$ is the differential input voltage to the OP, equal to $V^+ - V^-$. In this circuit, the input current to $V^+$ is negligibly small and $V_{in}$ is also very small for a high gain OP.

A polarizing voltage Vref is applied to the non-inverting input terminal $V^+$ of the OP at one end, and the other end of Vref is connected to ground or the negative power supply and the RE terminal of the liquid solution, the current through which is to be measured. The inverting terminal input $V^-$ is connected to the WE terminal of the solution and one end of the pass transistor. Since the $V^+$ and $V^-$ difference voltage is nearly zero, the Vref also appears across the electrodes of the solution. However, the input current to the OP is negligibly small, because of high input impedance, and all the current from WE flows through M1.

A capacitor C1 is connected between the output terminal of the OP and the inverting input terminal to insure stability as is commonly practised.

The current from the pass transistor flows to the chopper 11. The chopper is a current switch, having a differential pair of MOSFETs M2 and M3. The current switch is controlled by a clock signal CKO. The clock signal is applied to the gate input of M3 and an inverted clock signal CKO, dervied from inverter INV, is applied to the gate of M2. The sources of M2 and M3 are connected together and fed from the transconductance amplifier 10. When CKO signal is high, M3 is turned on and the output current from 10 flows through M3. When the clock signal CKO is low, M2 is turned on, M3 is off, and the current from 10 is diverted to the drain supply AGND, which is at ac ground. In this manner, the current switch functions as a chopper to convert the dc current from the solution to ac pulses at the clock frequency. From this stage on, the signal is processed as an ac signal. Thus, the dc drift and the low frequency 1/f noise can be minimized or eliminated.

Figure 2:
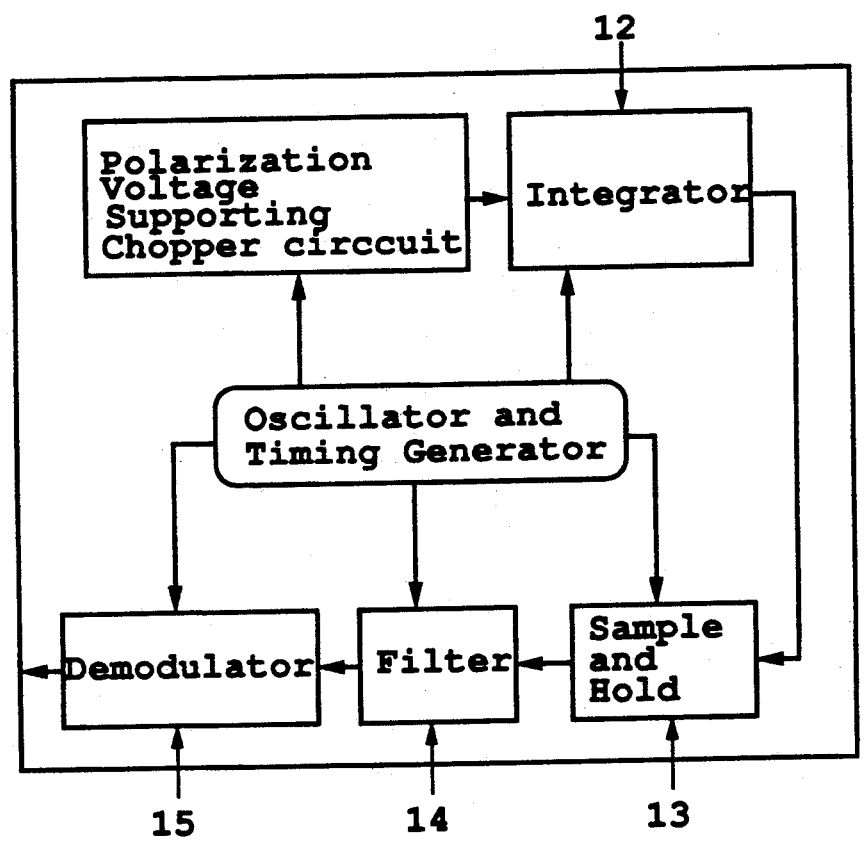
FIG. 2 shows a complete block diagram of a system for measuring low dc currents.

The complete block diagram of the measuring system is shown in FIG. 2. In addition to the input circuit with the transconductance amplifier 10 and the chopper 11, the system includes an integrator 12, a sample-and-hold circuit 13, a filter 14 and a demodulator 15. These circuits can be implemented as CMOS integrated circuit. For such implemention, switched capacitor techniques can often be used to replace resistors for smaller size and higher accuracy.

Due to the fast switching of the current switch, the spike signal generated by the chopping action has a wide band spectrum. The integrator 12 is a low pass filter. By using the integrator, the chopped current can be converted to a voltage and the high frequency switching noise can be smoothed out.

The sample-and-hold circuit 13 samples the voltage from the integrator 12 at the end of every phase of integration for a short duration, and holds the voltage for the entire clock duration.

The filter stage 14 is used to reduce the feedthrough noise generated by the chopper. The filter 14 consists of three sections: an antialiasing filter AAF, a decimater DEC and a bandpass filter BF.

The antialiasing filter is a continuous-time filter, used to prevent the aliasing distortion which is produced by the sampling operation of the switched capacitor circuits. Aliasing is the distortion caused by the overlapping of the different frequency spectra of a sampled data system using switched capacitors and creating unwanted signals.

The decimater is a low-pass filter, clocked at a higher harmonic of the main clock frequency. Using the decimeter, one can use a lower order filter, which requires smaller IC chip area.

The band-pass filter retains the signal but rejects the noise.

After filtering, the ac signal is demodulated and the original input dc current signal is restored. However, the dc signal is now free from drift and noise, because of the ac processing.

While the foregoing description is devoted to the measurement of low dc current from a liquid solution, the technique is not limited to low dc current nor only to liquid solution. The technique can also be used to measure the V-I characteristic or the resistance of any two terminal device.

What is claimed is:

1. An amplifier circuit for measuring dc current through a resistance in which said current does not flow through a voltage source applied across said resistance, comprising:
   a transconductance amplifier having inverting and non-inverting input terminals, high input impedance, and nearly zero input offset voltage between said input terminals,
   said transductance amplifier having an output current equal to said current to be measured,
   said voltage source voltage applied between said non-inverting input terminal and the negative terminal of a dc power supply,
   said transconductance amplifer also serving as a voltage follower to apply said voltage across said resistance connected between said inverting input terminal and said negative terminal of said dc power supply.

2. An amplifier for measuring dc current as described in claim 1, wherein said transconductance amplifier comprises:
   an operational amplifier,
   a pass transistor,
   said operational amplifier having said inverting and non-inverting input terminals,
   an output of said operational driving control electrode of said pass transistor,
   said pass transistor having an input terminal connected to said inverting terminal of said operational amplifier,
   said pass transistor having output terminal for furnishing said output current.

3. An amplifier for measuring dc current as described in claim 2, wherein said pass transistor is an MOSFET having a gate serving as said control electrode, source serving as said input terminal, and drain serving as said output terminal.

4. An amplifier for measuring dc current as described in claim 2, wherein a frequency compensating capacitance is connected between said output terminal of said operational amplifier and said inverting input terminal of said operational amplifier.

5. An amplifier for measuring dc current as described in claim 1, wherein said output current from said transconductance amplifier is applied to a chopper to convert said dc current to an ac signal.

6. An amplifier for measuring dc current as described in claim 5, wherein said chopper is a current switch, which is clocked to switch said dc current either to an ac ground or to following signal processing stages.

7. An amplifier for measuring dc current as described in claim 6, wherein said current switch is a differential transistor pair with said output current from said transductance amplifier fed to common terminal of said transistor pair, said current flowing only through one of said transistors and controlled by a clock signal applied to the control electrode of one transistor of said pair, and a complementary clock signal applied to another control electrode of another transistor of said pair.

8. An amplifier for measuring dc current as described in claim 7, wherein said transistors are MOSFETs.

9. An amplifier for measuring dc current as described in claim 7, wherein said signal processing stages process said ac signal and convert said ac signal to a dc signal which is proportional to said current flowing in said resistance.

10. An amplifier for measuring dc current as described in claim 9, wherein said processing stages include: an integrator, a sample-and-hold circuit, a filter, a demodulator and a timing generator.

11. An amplifier for measuring dc current as described in claim 10, wherein said amplifier, said current switch, and said processing stages are all integrated in an IC.

* * * * *